MULTIVIBRATOR EMPLOYING VOLTAGE CONTROLLED VARIABLE CAPACITANCE ELEMENT IN A COUPLING NETWORK

Filed Jan. 10, 1962 2 Sheets-Sheet 1

INVENTOR.
ROBERT H. NORWALT
BY John V. Regan
ATTORNEY

Aug. 17, 1965 R. H. NORWALT 3,201,602

MULTIVIBRATOR EMPLOYING VOLTAGE CONTROLLED VARIABLE CAPACITANCE ELEMENT IN A COUPLING NETWORK

Filed Jan. 10, 1962 2 Sheets-Sheet 2

INVENTOR.
ROBERT H. NORWALT
BY
John V. Regan
ATTORNEY 3,201,602

MULTIVIBRATOR EMPLOYING VOLTAGE CONTROLLED VARIABLE CAPACITANCE ELEMENT IN A COUPLING NETWORK

Robert H. Norwalt, Sherman Oaks, Calif., assignor to Radio Corporation of America, a corporation of Delaware Filed Jan. 10, 1962, Ser. No. 165,425
4 Claims. (Cl. 307—88.5)

This invention relates to pulse circuits, and in particular to improved variable width pulse generating circuits.

Monostable circuits, such as one-shot multivibrators, are well known in the art. A monostable multivibrator has one stable state in which the circuit remains until caused to change to the other state by the application of a trigger signal. After a period of time, determined by the *r–c* time constant of a timing circuit, the multivibrator goes back to its stable state. Thus, an output pulse from the multivibrator has a duration or width determined by the time constant of the timing circuit.

It is often desirable in applications such as telemetering and computers, for instance, to produce pulses of variable width. The usual way to vary the output pulse width of a multivibrator is to vary the time constant of the circuit by the use of manual trimmer capacitors, or manually switchable capacitors. However, it is often advantageous to be able to vary the capacitance and hence the time constant of the circuit remotely by electrical means. It is therefore an object of this invention to provide an improved pulse circuit that includes means to electrically control the duration of an output pulse.

It is another object of this invention to provide an improved multivibrator circuit producing an output pulse of variable width.

It is a further object of this invention to provide an improved monostable multivibrator producing an output pulse having a pulse width determined by the amplitude of an input control signal.

In accordance with an example of the invention, a monostable circuit includes, in one of the cross-coupling networks a capacitance element that varies as a function of the voltage applied thereacross, so that a variable control voltage applied across the capacitance element changes the *r–c* time constant of the circuit as a function of the amplitude of the applied voltage.

Figure 1:
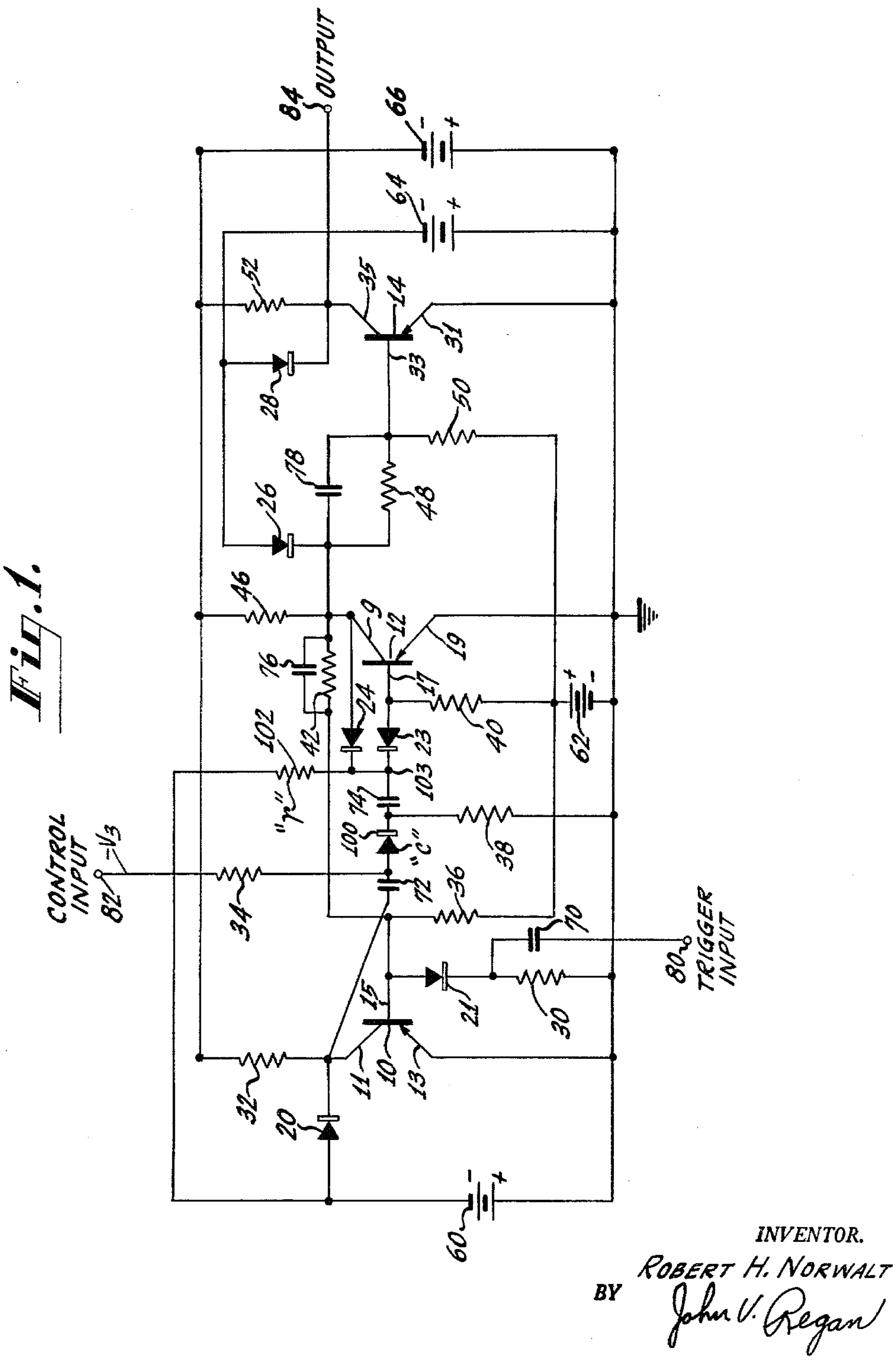
Figure 2:
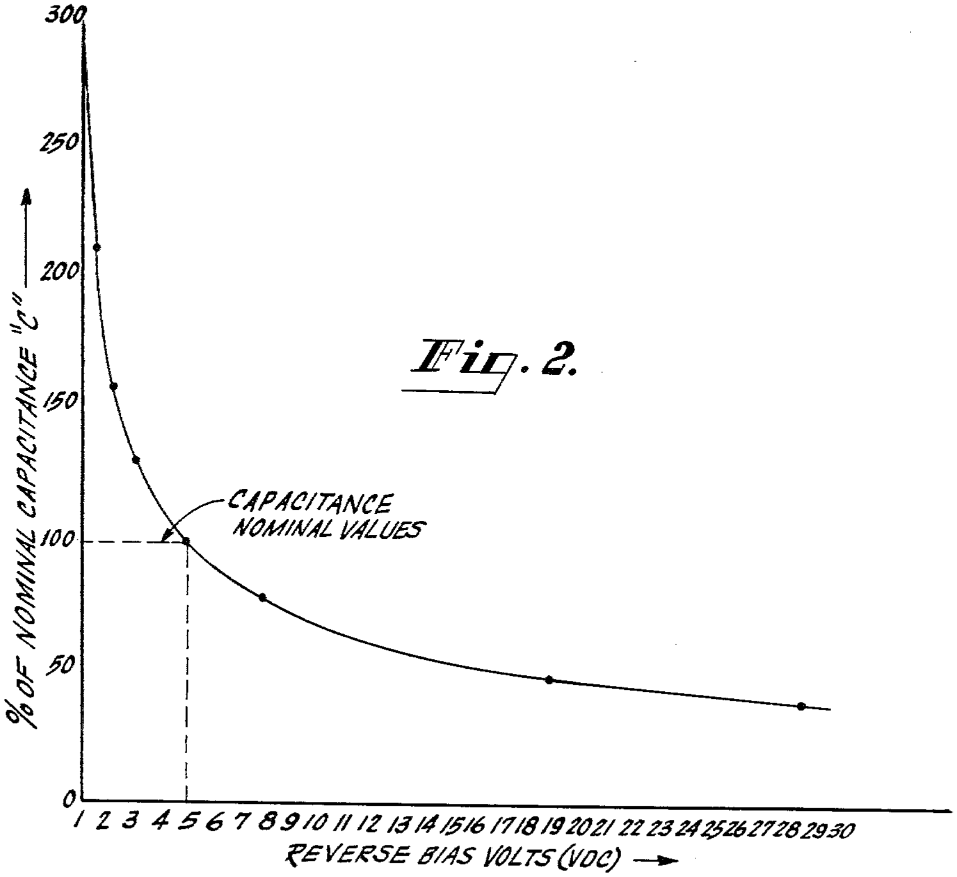
Figure 3:
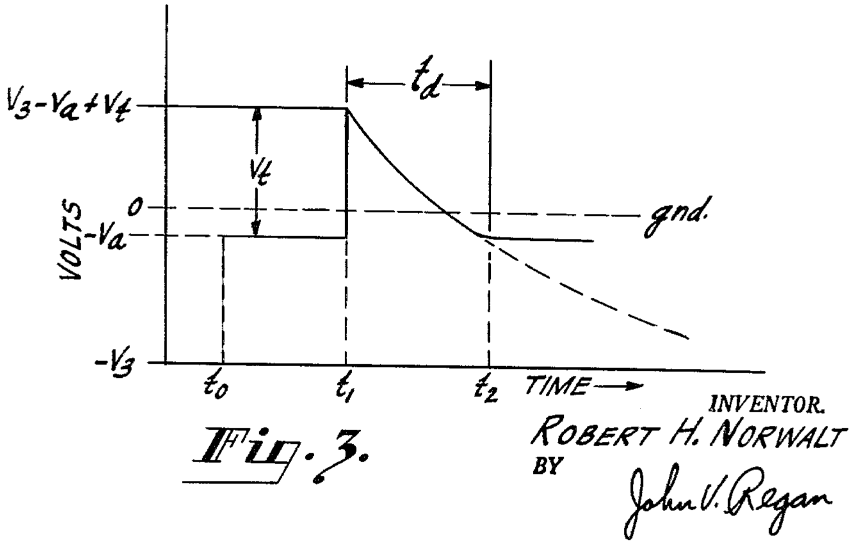

The invention will be best understood from the following description of an embodiment of this invention illustrated in the accompanying drawing, in which:

FIGURE 1 of the drawings illustrates a variable width pulse generating circuit constructed according to the teachings of the invention;

FIGURE 2 is a graph that illustrates the typical capacitance versus bias voltage characteristics of the variable capacitance diode used in the embodiment of FIGURE 1; and, FIGURE 3 illustrates the waveform of the voltages involved in the calculation of the delay time of the circuit of FIGURE 1.

Referring now to FIGURE 1, there is shown a pair of transistors 10, 12 arranged in a monostable circuit and an output transistor 14. The transistors 10, 12 and 14 have, respectively, base electrodes 15, 17 and 33, emitter electrodes 13, 19 and 31, and collector electrodes 11, 9 and 35. Transistors of the PNP type are illustrated. However, it is to be understood that the invention is applicable to transistors of the NPN type, as well as to other active electron devices, such as vacuum tubes, with appropriate changes. The emitters 13, 19 and 31 are connected to a reference potential indicated in the drawing by the conventional ground symbol. The collector electrodes 11, 9 and 35 are connected to a potential source 66, negative with respect to ground, through resistors 32, 46 and 52, respectively. Clamp diodes 20, 26 and 28 are connected at their cathode electrodes to collector electrodes 11, 9 and 35, respectively, and clamp diode 20 and clamp diodes 26, 28 are connected at their anodes to the negative terminals of potential bias sources 60 and 64, respectively. Potential bias sources 60, 64 and 66 have their positive terminals connected to ground.

Collector electrode 11 of transistor 10 is connected through a coupling network comprising direct-current isolating capacitor 72, variable capacitance diode 100, direct-current isolating capacitor 74 and diode 23 to the base electrode 17 of transistor 12. Capacitor 72 couples collector electrode 11 to the anode of diode 100, but isolates it from direct current so that the conduction state of transistor 12 (on or off) will not affect the value of capacitance exhibited by diode 100. The cathode of diode 100 is connected to ground through resistor 38, and is also coupled through capacitor 74 to the cathode of diode 23. The base electrode 17 of transistor 12 is connected to the anode of the diode 23.

Collector electrode 9 of transistor 12 is coupled to the base electrode 15 of transistor 10 through a parallel circuit comprising resistor 42 and capacitor 76. This parallel circuit is part of a voltage divider circuit that includes resistors 46, 42 and 36. Capacitor 76 is what is commonly known as a speed-up capacitor. Resistor 36 is connected between the base electrode 15 of transistor 10 and the positive terminal of potential bias source 62. Potential bias source 62 has a negative terminal connected to ground and a positive terminal connected through resistor 40 to the base electrode 17 of transistor 12.

A trigger signal of negative polarity is applied at trigger input terminal 80 and through capacitor 70 to the connection of the cathode electrode of diode 21 and one end of resistor 30, the other end of which is grounded. The anode of diode 21 is connected to the base electrode 15 of transistor 10. Diode 21 is used for triggering purposes only, i.e., to avoid positive-going signals, that may appear at terminal 80, from being coupled to the base electrode 15 of transistor 10.

A varying control signal is applied at terminal 82 through decoupling resistor 34 to the anode electrode of variable capacitance diode 100. Variable capacitance diode 100 exhibits a junction capacitance "*c*" that is a function of the reverse voltage applied across it, as illustrated by the graph of FIGURE 2.

FIGURE 2 shows the typical capacitance versus reverse bias voltage of a variable capacitance diode, such as a silicon alloy vericap used in the embodiment of FIGURE 1. The ordinate of the graph represents percent values of the nominal capacitance *c*. The abscissa represents the reverse voltage applied across the diode. As shown in the graph, the value of the capacitance exhibited by the diode declines rapidly from a value of 300% to 0 volt bias to a value of 100% at −4 volt bias. The slope of the curve decreases considerably from −4 volt bias to −40 volt bias, the capacitance at that point being 40% of the nominal value.

Resistor 102, which is connected at one end to the cathode electrode of diode 23 and at its other end to bias source 60, determines, in conjunction with the value *c* of diode 100, the *r–c* time constant of the timing circuit. Resistor 34 is much larger, say 10 times than resistor 102 and therefore does not appreciably affect the time constant of the circuit.

Diode 24 is connected between collector electrode 9 at the junction 103 between variable transistor 12 and resistor 102 as a current clamp. Diode 24 operates to bypass all the excess current above a set value from the collector 9 of transistor 12 to ground and to thereby prevent saturation of transistor 12.

Output transistor 14 is normally biased off by the voltage divider comprising resistors 48 and 50. Resistor 50 is connected between the positive terminal of the bias source 62 and the base electrode 33 of transistor 14. Resistor 48 is connected between the collector electrode 9 of transistor 12 and the base electrode 33 of transistor 14. Transistor 14 is an output stage and provides isolation of the monostable circuit from the load (not shown) connected at output terminal 84. The transistor 14 also provides amplification for the output pulse. The output terminal 84 is connected to the collector electrode 35 of transistor 14.

Referring now to the operation of the circuit, the voltage divider comprising resistor 102, diode 23, and resistor 40 applies a negative bias to base electrode of transistor 12. The transistor 12 is normally conducting and the voltage at collector electrode 9 is close to ground potential. A positive bias from source 62 is applied to the base electrode 15 of transistor 10 and the transistor 10 is normally cutoff. Under this condition, the voltage at the collector electrode 11 would tend to be the same as that of bias potential source 66. However, the voltage at collector electrode 11 is held at a value close to the value of bias potential source 60 by diode 20, which starts conducting when the voltage at the collector 11 of transistor 10 becomes more negative than the value of bias potential source 60.

A negative trigger pulse is applied at terminal 80 to momentarily forward bias transistor 10. When transistor 10 starts conducting, the voltage at its collector electrode 11 increases towards zero (becomes less negative), cutting off diode 20. This positive-going voltage is applied through capacitor 72, diode 100, capacitor 74 and diode 23 to the base electrode 17 of transistor 12, decreasing its forward bias. The base current and the collector current of transistor 12 decrease, decreasing the voltage at collector electrode 9 towards the value of bias potential source 66.

When the voltage at the collector electrode 9 reaches a value that is slightly more negative than the value of bias potential source 64, diode 26 starts conducting clamping the voltage of collector electrode 9. A portion of the voltage at the collector electrode 9 of transistor 12 is coupled back to the base transistor electrode 15 of transistor 10 via resistor 42, capacitor 76, increasing its conduction. This regeneration results in a rapid change of the state of both transistors, i.e., transistor 10 becomes fully conducting and transistor 12 becomes cut-off.

The capacitance *c* of diode 100 was initially charged through resistors 34 and 38 to a value depending on the voltage applied at terminal 82. When the voltage at the collector electrode 11 starts increasing towards zero, the capacitance of diode 100 discharges through resistor 102 in a period of time determined by the time constant *r-c*, in which *r* is the value of resistor 102 and is the capacitance exhibited by diode 100. Capacitors 72 and 74 are used to isolate diode 100 from direct current, so that the value of the capacitance exhibited by capacitance diode 100 is independent of the state of conduction of transistors 10 and 12, but will depend on the value of the voltage applied at control terminal 82. Capacitors 72 and 74 have a value that is large in comparison to the value of the capacitance of diode 100, and being in series with diode 100 they do not appreciably affect the time constant of the circuit.

Due to the discharge of the capacitance of diode 100, the potential of the base electrode 17 becomes less positive, and transistor 12 starts conducting when its base electrode 17 becomes slightly negative with respect to ground. The voltage at the collector electrode 9 of transistor 12 increases towards zero, and this change is coupled to the base 15 of transistor 10 causing it to be turned off.

Diodes 23 and 24 are used in what is commonly known as double diode clamping to insure that transistor 12 is never driven into saturation. This double diode clamping decreases the delay time of the circuit.

The delay time $t_d$ of the circuit can be calculated using the waveform shown in FIGURE 3. The delay time of the circuit is equal to the time in which the multivibrator remains in its unstable state, i.e., the width of the output pulse.

Referring to FIGURE 3 now, there is shown the waveform of the potential at junction point 103, which is the junction point of capacitor 74, diodes 23 and 24, and resistor 102.

At time $t_0$, transistor 12 is conducting and transistor 10 is cutoff. The potential at junction point 103 is equal to a value $V_a$ negative with respect to ground. At time $t_1$, a trigger signal is applied to the base electrode 15 of transistor 10, and transistor 10 starts conducting. The potential at collector electrode 15 rises towards ground. This positive-going voltage may be assumed to have a magnitude of $V_t$ and is applied through capacitor 72, diode 100 and capacitor 74 to junction point 103. The potential at junction point 103 is increased by $V_t$ from a value equal to $-V_a$ to a value equal to $(V_t-V_a)$, as shown in FIGURE 3. The capacitance of diode 100 starts immediately after time $t_1$ to discharge towards a value equal to $-V_3$, which is the control voltage applied across diode 100. When junction point 103 reaches a value near $-V_a$ at time $t_2$, transistor 12 starts conducting again. $t_d$ is then equal to $t_2-t_1$.

Let $r$ be approximately the resistance of resistor 102. The voltage difference between the junction point 103 and the anode of diode 100 at time $t_1$ is, approximately, $V_t-V_a+V_3$.

The voltage difference between the junction point 103 and the anode of diode 100 at time $t_2$ is approximately $V_3-V_a$.

Then $$t_d=rc[\ln(V_t-V_a+V_3)-\ln(V_3-V_a)]$$

Transistor 14 is normally biased to be cutoff by the voltage divider comprising resistors 48 and 50. When transistor 12 is turned on as a result of the application of a trigger signal, transistor 14 becomes conductive. The voltage at its collector electrode 35 varies from a value close to the value of clamp potential source 64, due to the clamping action of diode 28 when the transistor is cutoff, to a value close to ground potential when the transistor is conducting. The output pulse is taken at terminal 84 which is connected to collector electrode 35.

The following values of circuit elements are given solely by way of illustration of an operative circuit that has been built.

| | |
|---|---|
| Transistor: | |
| 10 | 2N828 |
| 12 | 2N828 |
| 14 | 2N828 |
| Diode: | |
| 20 | IN695 |
| 21 | IN695 |
| 23 | IN914 |
| 24 | IN695 |
| 26 | IN695 |
| 28 | IN695 |
| Resistor: | |
| 30 | 1.47K |
| 32 | 1.33K |
| 34 | 22K |
| 38 | 22K |
| 40 | 19.6K |
| 42 | 1.96K |
| 46 | 825Ω |
| 48 | 1.0K |
| 50 | 7.5K |
| 52 | 825Ω |
| 102 | 2K |

Capacitor:

| | |
|---|---|
| 70 | pf 47 |
| 72 | pf 10,000 |
| 74 | pf 10,000 |
| 76 | pf 22 |
| 78 | pf 33 |

Diode:

| | |
|---|---|
| 100 | PSI V–100 |

Bias potential source:

| | |
|---|---|
| 60 | v 6.8 |
| 62 | v 12 |
| 64 | v 4.7 |
| 66 | v 16 |

Although there has been described a system incorporating a one-shot multivibrator, the invention is also applicable to astable multivibrators and other pulse circuits having an intrinsic *r-c* time constant.

What is claimed is:

1. A multivibrator circuit comprising first and second active electron devices each having input and output electrodes; a first coupling network coupled from the output electrode of said second device to the input electrode of said first device; a second coupling network, exhibiting a time constant and including a timing capacitance element providing a capacitance that varies as a function of a voltage applied thereacross, coupled between the output electrode of said first device and the input electrode of said second device; means biasing said first device normally to be cut-off; means biasing said second device normally to be conducting; means to apply a trigger signal to said first device to drive it into conduction, and means to apply a control voltage across said timing capacitance element to control its capacitance and the time constant of said second coupling network to control the conduction time of said first device.

2. In a multivibrator circuit including a bias source having an output terminal and a terminal connected to a point of reference potential, said multivibrator circuit including first and second active electron devices each having input and output electrodes, a cross-coupling timing circuit comprising a direct-current isolating capacitor, a capacitance diode, and a second direct-current isolating capacitor connected in series between the output electrode of said first active electron device and the input electrode of the said second active electron device, a control circuit including a control terminal, a first resistor, said capacitance diode, a second resistor, and a reference terminal connected in series, means to apply a control signal between said control and reference terminals to control the capacitance of said capacitance diode, and a timing resistor coupled from the input electrode of said second active electron device to said output terminal of said bias source, whereby said capacitance diode and said timing resistor provide a variable time constant determined by the value of control signal applied to said capacitance diode.

3. A multivibrator circuit comprising first and second active electron devices each having input and output electrodes, a first cross-coupling network coupled from the output electrode of said second device to the input electrode of said first device, a second cross-coupling network exhibiting a time constant and including a first direct-current isolating capacitor, a timing capacitance element providing a capacitance that varies as a function of a voltage applied thereacross, and a second direct-current isolating capacitor coupled in series in the order named between the output electrode of said first device and the input electrode of said second device, a timing resistor coupled from the input electrode of said second device to a point of fixed voltage level, and means to apply a control voltage across said timing capacitance element to control its capacitance and thereby control the time constant of said second cross-coupling network.

4. In a multivibrator circuit including a bias source having an output terminal and a terminal connected to a point of reference potential, said multivibrator circuit including first and second active electron devices each having input and output electrodes; a first coupling circuit coupled between the output electrode of said second active electron device and the input electrode of said first active electron device; a second coupling circuit coupled between the output electrode of said first active electron device and the input electrode of said second active electron device; said second coupling circuit including a direct-current isolating capacitor, a capacitance diode, and a second direct-current isolating capacitor connected in series in the order named; means to apply a control signal to said capacitance diode to control its capacitance; a timing resistor coupled from said output terminal of said bias source to said input electrode of said second active electron device, so that said capacitance diode and said timing resistor provide a variable time constant determined by the value of control signal applied to said capacitance diode.

References Cited by the Examiner

UNITED STATES PATENTS

| | | | |
|---|---|---|---|
| 3,021,492 | 2/62 | Kaufman | 331—177 X |
| 3,029,339 | 4/62 | Pan | 331—36 |

OTHER REFERENCES

Components and Materials, Electronics, April 8, 1960, Transistors Shrink To Pico Size, pages 82, 84.

ARTHUR GAUSS, *Primary Examiner.*